United States Patent
Dexter et al.

(10) Patent No.: US 10,367,135 B2
(45) Date of Patent: Jul. 30, 2019

(54) METHOD OF FABRICATING A BASE PLATE FOR PIEZO ACTUATION

(71) Applicant: INTRI-PLEX TECHNOLOGIES, INC., Santa Barbara, CA (US)

(72) Inventors: David Django Dexter, Goleta, CA (US); Damon Douglas Brink, Ventura, CA (US); Ryan J. Schmidt, Santa Barbara, CA (US)

(73) Assignee: INTRI-PLEX TECHNOLOGIES, INC., Santa Barbara, CA (US)

( * ) Notice: Subject to any disclaimer, the term of this patent is extended or adjusted under 35 U.S.C. 154(b) by 387 days.

(21) Appl. No.: 15/147,551

(22) Filed: May 5, 2016

(65) Prior Publication Data

US 2016/0248000 A1  Aug. 25, 2016

Related U.S. Application Data

(62) Division of application No. 13/186,440, filed on Jul. 19, 2011, now Pat. No. 9,361,917.

(51) Int. Cl.
| | |
|---|---|
| *B21D 28/10* | (2006.01) |
| *H01L 41/22* | (2013.01) |
| *G11B 5/48* | (2006.01) |
| *G11B 21/10* | (2006.01) |
| *H01L 41/053* | (2006.01) |

(52) U.S. Cl.
CPC .............. *H01L 41/22* (2013.01); *B21D 28/10* (2013.01); *G11B 5/4873* (2013.01); *G11B 21/10* (2013.01); *H01L 41/053* (2013.01); *Y10T 83/0448* (2015.04)

(58) Field of Classification Search
CPC ........ B21D 28/02; B21D 28/06; B21D 28/10; B21D 28/14; B21D 28/16; B26D 3/085; B26D 2007/189; H02G 3/085; B65B 35/30; Y10T 83/0448; H01L 41/22; H01L 41/053
See application file for complete search history.

(56) References Cited

U.S. PATENT DOCUMENTS

| | | |
|---|---|---|
| 2,350,004 A | 3/1943 | Whistler et al. |
| 3,580,122 A | 5/1971 | Powell |
| 3,993,010 A | 11/1976 | Taniuchi |
| (Continued) | | |

FOREIGN PATENT DOCUMENTS

| | | |
|---|---|---|
| JP | 55-077941 | 6/1980 |
| JP | 55-103235 | 8/1980 |

*Primary Examiner* — Edward T Tolan

(57) ABSTRACT

A method of fabricating a base plate for piezoelectric actuation, comprises providing a plate having a major surface, striking a first removable portion of the plate in a first direction substantially normal to the major surface to shear the first removable portion relative to the plate by a shear distance that is less than the plate thickness. Striking the first removable portion in a second direction substantially opposite the first direction to reduce the shear distance by a reduction in shear that is less than the plate thickness. Leaving it the first removable portion in place rather than removing. Alternately, the removable portion may be created by lancing one or more portions spanning at least one opening through a base plate adjacent a first side of at least one opening and adjacent a second side of the at least one opening.

10 Claims, 6 Drawing Sheets

(56) References Cited

U.S. PATENT DOCUMENTS

| | | | |
|---|---|---|---|
| 4,307,498 A | 12/1981 | Say | |
| 4,362,078 A * | 12/1982 | Ohnishi | B21D 28/16 |
| | | | 83/50 |
| 4,445,272 A | 5/1984 | Bruhn et al. | |
| 4,477,537 A * | 10/1984 | Blase | B21D 28/16 |
| | | | 428/577 |
| 4,611,480 A | 9/1986 | Willetts | |
| 4,785,655 A | 11/1988 | Pistritto et al. | |
| 4,825,339 A * | 4/1989 | Boudon | H02G 3/085 |
| | | | 174/385 |
| 4,869,969 A | 9/1989 | Pavlov et al. | |
| 5,163,223 A * | 11/1992 | Wurster | B21D 28/16 |
| | | | 29/874 |
| 5,191,171 A * | 3/1993 | Bordwell | H02G 3/085 |
| | | | 174/666 |
| 5,320,013 A | 6/1994 | Nonami et al. | |
| 5,794,501 A | 8/1998 | Sasaki et al. | |
| 5,936,803 A | 8/1999 | Berding | |
| 6,307,715 B1 | 10/2001 | Berding et al. | |
| 6,597,538 B1 | 7/2003 | Kashima et al. | |
| 6,733,899 B2 | 5/2004 | Uehara et al. | |
| 7,370,505 B2 | 5/2008 | Ser et al. | |
| 7,464,575 B2 * | 12/2008 | Miyahara | B21D 28/02 |
| | | | 72/329 |
| 8,015,851 B2 | 9/2011 | Sasaki et al. | |
| 8,113,030 B2 | 2/2012 | Fujimura et al. | |
| 2001/0008475 A1 | 7/2001 | Takagi et al. | |
| 2006/0277961 A1 | 12/2006 | Miyahara | |
| 2008/0024931 A1 | 1/2008 | Johnson et al. | |
| 2009/0165525 A1 | 7/2009 | Schlatter et al. | |
| 2010/0084188 A1 * | 4/2010 | Rajvanshi | H02G 3/085 |
| | | | 174/666 |

\* cited by examiner

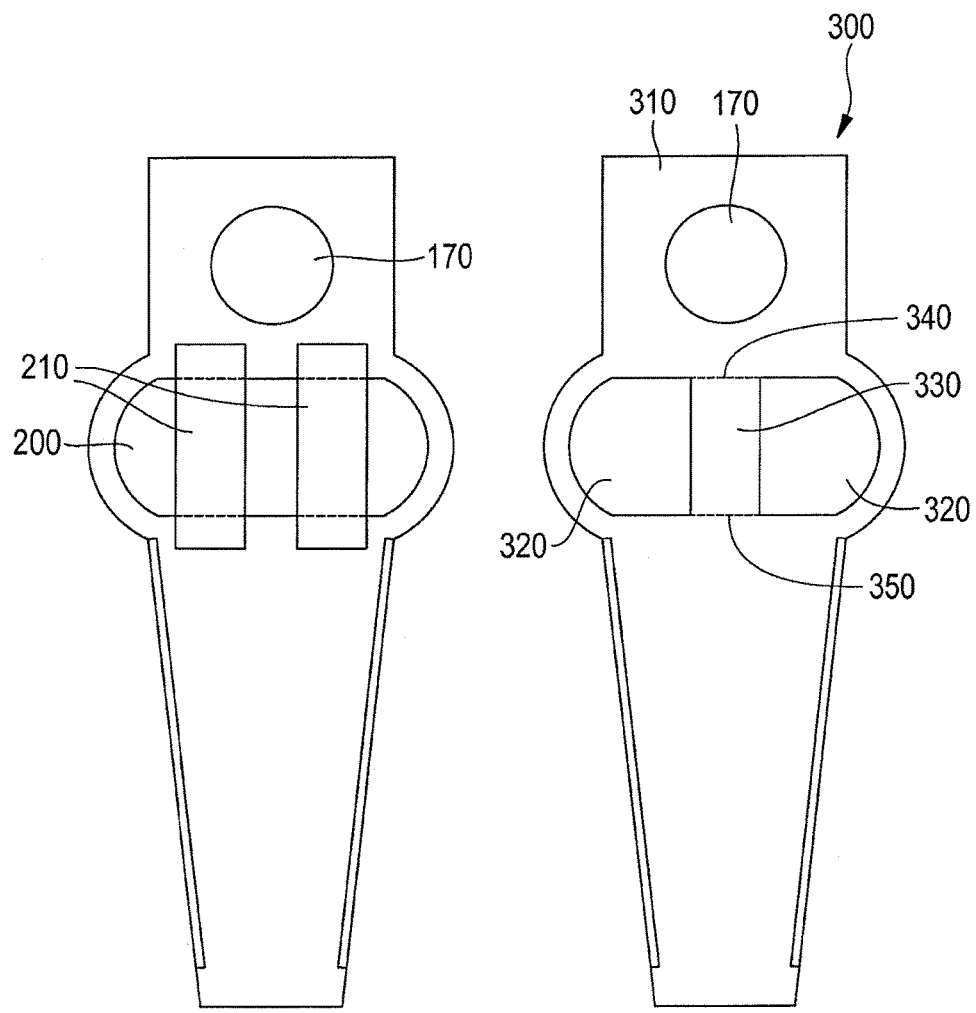

METHOD OF FABRICATING A BASE PLATE FOR PIEZO ACTUATION

CROSS REFERENCE TO RELATED APPLICATIONS

This application is a division of U.S. application Ser. No. 13/186,440 filed Jul. 19, 2011 for METHOD TO FABRICATE A BASE PLATE FOR PIEZO ACTUATION.

1. FIELD OF THE INVENTION

Implementations consistent with the principles of the invention generally relate to the field of disk drive technology, more specifically to methods of manufacturing piezo-capable base plate assemblies.

2. DESCRIPTION OF RELATED ART

In conventional hard disk drives, data are stored on magnetizable surfaces of a plurality of rotating disks that are mounted in a coaxial stack on a housing of the drive. As shown and described in U.S. Pat. No. 7,190,555, which is incorporated herein by reference in its entirety, transducer heads that write data to and read data from the disk surfaces may be supported by an actuator that is mounted on the same housing and can be actuated to position the transducer heads in alignment with concentric data tracks defined on the disks. Each transducer head may be attached to one end of a head suspension that is connected to an actuator arm that extends from the actuator body. Each suspension may include a flexible base plate. The suspension may act as a spring that forces the head against the disk surface with an accurate load force or "gram load." An air bearing caused by the rotating disks may lift the heads slightly off of the disks so that the heads fly at a specific height across the disk surfaces. The air bearing force may be counteracted by the suspension gram load.

The head suspension may be attached to an actuator arm using a conventional swage mount that forms a part of the head suspension. The combined swage mount, base plate, and actuator arm make up the head suspension, and the suspension has the hub of the swage mount extending beyond the base plate and concentric with the clearance hole.

FIG. 1 illustrates a disc drive assembly 100 including an actuator arm 110, a base plate 120 and a swage mount 130. A fully assembled disk drive may have an actuator arm assembly and a stack of spaced-apart disks rotatable about a separate axis. The arm assembly may include a plurality of actuator arms 110, which extend into the spaces between the disks. One such actuator arm 110 is shown in FIG. 1. Attached to the actuator arm near the tip 140 may be a base plate 120. The actuator arm 110 when assembled in a stack with a number of identical actuator arms may rotate about the actuator arm axis 150.

The base plate 120 may include a base section 160 having a base plate boss hole 170. The base plate 120 may include a resilient section 180 located between the base section 160 and 10 a protrusion section 190 of the base plate 120. The resilient section 180 may be formed to create an angular offset between the base section 160 and protrusion section 190. The degree of bending of the suspension may determine the downward preload force of a slider toward a disk surface. The geometry of the base plate in resilient section 180 and/or the size of an aperture 200 in the resilient section 180 may establish the resilience of the base plate 120.

Piezo-driven actuation may be used to deform/deflect the base plate to induce lateral motion of the protrusion section 190 of base plate 120. As shown in FIG. 2, a pair of piezoelectric microactuators 210 may be attached to opposite sides of aperture 200 in the resilient section 180 of base plate 120. Differential electrical charges may be applied to each of piezoelectric microactuators 210 to pivot protrusion section 190 of base plate 120 relative to base section 160 of base plate 120.

Various designs of piezo-capable base plates have been attempted in the art. Many designs are difficult to handle after fabrication due to nesting and interlocking of plates. For example, in the exemplary piezo-capable base plate of FIG. 2, the aperture 200 may permit interpenetration of multiple base plates after fabrication and before installation of piezoelectric microactuators 210. Handling of piezo-capable base plates may be difficult and may cause problems with bonding piezoelectric elements. Many of the designs in the art lack out-of-plane and lateral stiffness, which can undesirably lower the resonant frequency of various suspension modes. Current manufacturing attempts have failed to provide a sufficiently compliant baseplate flange in the longitudinal piezo actuation direction.

Thus, there is a need in the art for a cost effective means of manufacturing base plates, while addressing the above issues or other limitations in the art.

There is a need in the art for base plates that prevent nesting and interlocking of multiple parts during fabrication and transfer from initial fabrication to a later point in the assembly process, such as the bonding of piezoelectric elements to the base plate or ultimate incorporation into a disk drive assembly.

SUMMARY OF THE INVENTION

Various methods relating to manufacturing piezo-capable base plate assemblies are disclosed and claimed.

In certain embodiments, a method of fabricating a base plate for a head suspension assembly comprises providing a plate; creating at least one opening through the plate, the plate including a first spanning portion that extends from a first side of the at least one opening to a second side of the at least one opening; lancing the first spanning portion adjacent the first side and adjacent the second side, so that the first spanning portion becomes removable by a reduced shear force where lanced; and leaving the first spanning portion in place rather than removing the 1 o first spanning portion.

In certain embodiments, a method of fabricating a base plate for piezoelectric actuation, comprises providing a plate defining a plate thickness and having a major surface; striking a first removable portion of the plate in a first direction that is substantially normal to the major surface with a cutting punch to shear the first removable portion relative to the plate by a shear distance that is less than the plate thickness; striking the first removable portion with a push back punch in a second direction substantially opposite the first direction to reduce the shear distance by a reduction in shear that is less than the plate thickness; and leaving the first removable portion in place rather than removing the first removable portion. In certain embodiments, the reduction in shear is substantially equal to the shear distance.

Other aspects and advantages of the present invention may be seen upon review of the figures, the detailed description, and the claims that follow.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein:

FIG. 2 is a top view of a base plate including two piezoelectric elements;

FIG. 3 is a top view of a base plate with a first spanning portion according to certain embodiments of the invention;

FIG. 11 is a top view of a base plate with a removable portion according to certain embodiments of the invention;

FIG. 12 is a top view of a base plate with a removable portion according to certain embodiments of the invention;

DETAILED DESCRIPTION OF THE PREFERRED EMBODIMENTS

Figure 1:
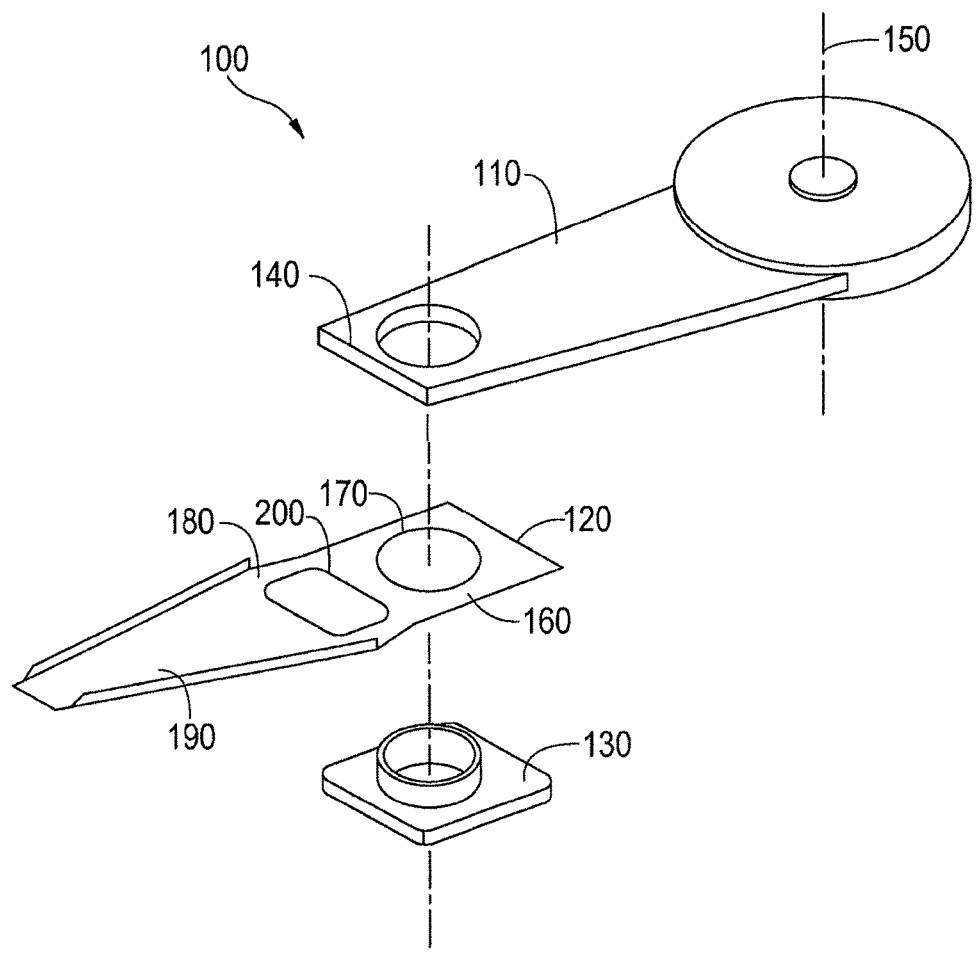
FIG. 1 is an exploded view of a disk drive magnetic head suspension assembly.

Certain embodiments of the invention relate to methods of manufacturing piezo-capable base plate assemblies.

Base plates for use with piezoelectric microactuators may have large openings where parts grouped together may undesirably interlock. Additionally, it is desirable to produce base plates that are sufficiently compliant to be deformed/deflected by piezoelectric microactuators. However, the more compliant the base plate is, the more likely it is to be damaged during handling. In accordance with certain embodiments of the invention, a variety of temporary structures may be used to prevent interlocking and to add structural rigidity until removal at an appropriate stage of the assembly process. For the purposes of this invention, lancing means modifying a surface to create a cleavage line along which a removable portion may be removed from a final part by a reduced shear force. Methods for modifying the surface include but are not limited to stamping, machining, etching, skiving, and other methods known to those of skill in the art for creating a cleavage line along which a removable portion may be removed from a final part by a reduced shear force.

FIG. 3 shows a base plate 300 in accordance with certain embodiments of the invention. Base plate 300 may be fabricated by providing a plate 310 and creating at least one opening 320 through plate 310. A first spanning portion 330 may extend from a first side of the at least one opening 320 to a second side of the at least one opening 320. The first spanning portion may be lanced along a first cleavage boundary 340 adjacent the first side and along a second cleavage boundary 350 adjacent the second side of the at least one opening 320 so that the first spanning portion 330 becomes removable by a reduced shear force where lanced. The first spanning portion 330 may be left in place rather than removed from plate 310 to prevent interlocking of multiple base plates 300 and to add structural rigidity until removal of first spanning portion 330 at an appropriate stage of the assembly process.

Figure 4:
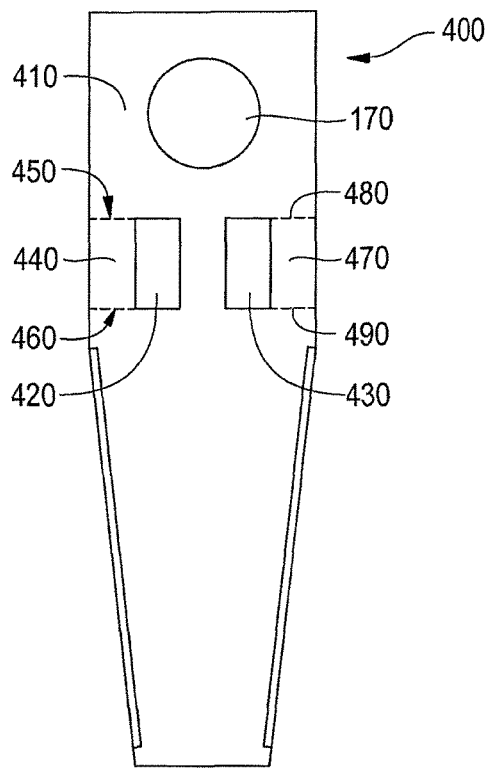
FIG. 4 is a top view of a base plate with a first spanning portion and a second spanning portion according to certain embodiments of the invention.

FIG. 4 shows a base plate 400 in accordance with certain embodiments of the invention. Base plate 400 may be fabricated by providing a plate 410 and creating a first opening 420 and a second opening 430 through plate 410. A first spanning portion 440 may extend from a first side of the first opening 420 to a second side of the first opening 420. The first spanning portion may be lanced along a first cleavage boundary 450 adjacent the first side and along a second cleavage boundary 460 adjacent the second side of the first opening 420 so that the first spanning portion 440 becomes removable by a reduced shear force where lanced.

A second spanning portion 470 may extend from a third side of the second opening 430 to a fourth side of the second opening 430. The second spanning portion may be lanced along a third cleavage boundary 480 adjacent the third side and along a fourth cleavage boundary 490 adjacent the fourth side, so that the second spanning portion 470 becomes removable by a reduced shear force where lanced. The first spanning portion 440 and/or the second spanning portion 470 may be left in place rather than removed from plate 410 to prevent interlocking of multiple base plates 400 and to add structural rigidity until removal of first spanning portion 440 and second spanning portion 470 at an appropriate stage of the assembly process. As shown in FIG. 4, first spanning portion 440 may comprise at least a portion of a first edge of plate 410 such that first opening 420 is not completely enclosed by the plate without first spanning portion 440. Second spanning portion 470 may comprise at least a portion of a second edge of plate 410 such that second opening 430 is not completely enclosed by plate 410 without second spanning portion 470.

Figures 5, 6:
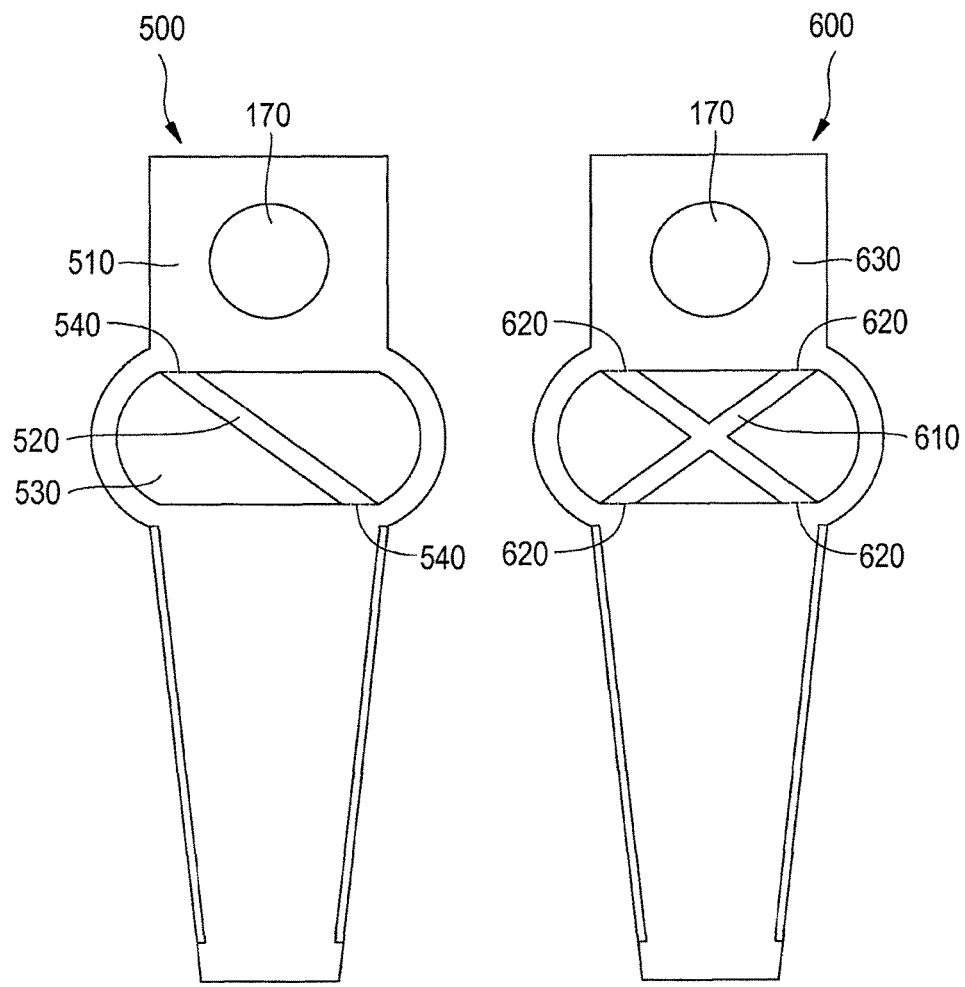
FIG. 5 is a top view of a base plate with a lateral spanning portion according to certain embodiments of the invention.
FIG. 6 is a top view of a base plate with an x-shaped spanning portion according to certain embodiments of the invention.

FIG. 5 shows a base plate 500 in accordance with certain embodiments of the invention. As shown, a first spanning portion 520 may extend laterally from a first side to a second side of an opening 530 formed in plate 510. The first spanning portion 520 may be lanced along cleavage boundaries 540 so that the first spanning portion 520 becomes removable by a reduced shear force where lanced. The first spanning portion 520 may be left in place rather than removed from plate 510 to prevent interlocking of multiple base plates 500 and to add structural rigidity until removal of first spanning portion 520 at an appropriate stage of the assembly process.

FIG. 6 shows a base plate 600 in accordance with certain embodiments of the invention. Base plate 600 may be fabricated with an x-shaped first spanning portion 610, which may be lanced along cleavage boundaries 620 so that the first spanning portion 610 becomes removable by a reduced shear force where lanced. The first spanning portion 610 may be left in place rather than removed from plate 630 to prevent interlocking of multiple base plates 600 and to add structural rigidity until removal of first spanning portion 610 at an appropriate stage of the assembly process.

Figure 7:
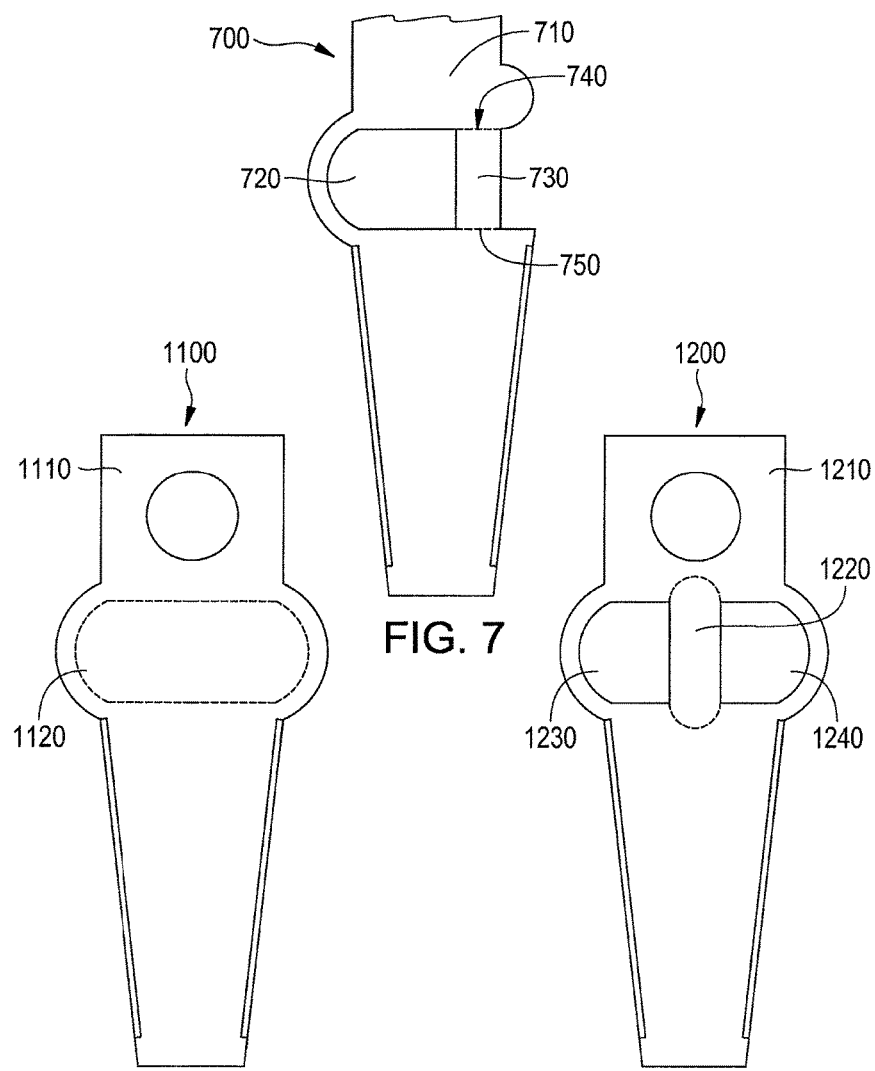
FIG. 7 is a top view of a base plate with a spanning portion according to certain 15 embodiments of the invention.

FIG. 7 shows a base plate 700 in accordance with certain embodiments of the invention. Base plate 700 may be fabricated by providing a plate 710 and creating at least one opening 720 through plate 710. A first spanning portion 730 may extend from a first side of the at least one opening 720 to a second side of the at least one opening 720. The first spanning portion may be lanced along a first cleavage boundary 740 adjacent the first side and along a second cleavage boundary 750 adjacent the second side so that the first spanning portion 730 becomes removable by a reduced shear force where lanced. The first spanning portion 730 may be left in place rather than removed from plate 710 to prevent interlocking of multiple base plates 700 and to add structural rigidity until removal of first spanning portion 730 at an appropriate stage of the assembly process. As shown in FIG. 7, first spanning portion 730 may comprise at least a portion of a first edge of the plate 710 such that at least one opening 720 is not completely enclosed by the plate without first spanning portion 730.

Figure 8:
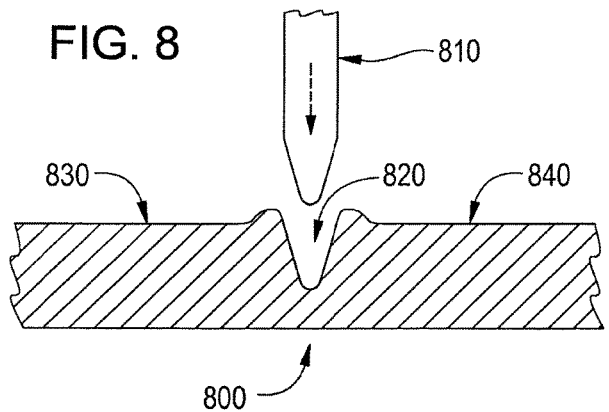
FIG. 8 is a side view of a section of a lanced base plate and a lancing punch according to certain embodiments of the invention.
Figure 13:
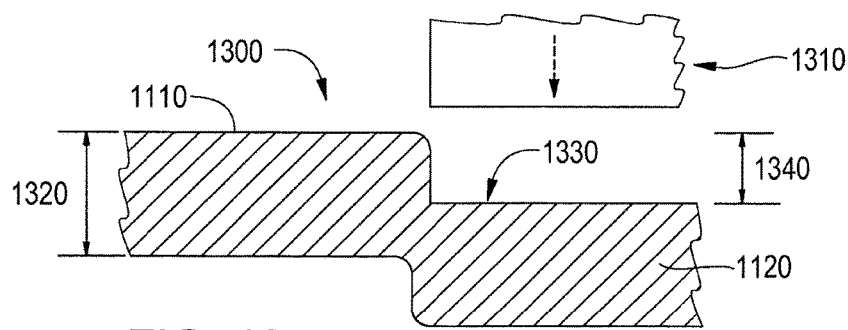
FIG. 13 is a side view of a section of a base plate and a cutting punch according to certain embodiments of the invention.
Figure 14:
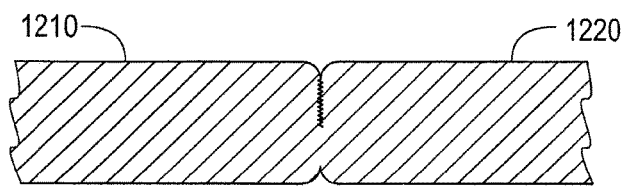
FIG. 14 is a side view of a section of a base plate and a push back punch according to certain embodiments of the invention.

FIG. 8 shows a method of lancing a surface according to certain embodiments of the invention. Base plate 800 may be struck by lancing punch 810 along a cleavage boundary 820 that separates a first spanning portion 830 and plate 840 such that the first spanning portion 830 becomes removable by a reduced shear force where lanced. The first spanning portion 830 may be left in place rather than removed from plate 840 to prevent interlocking of multiple base plates 800 and to add structural rigidity until removal of first spanning portion 830 at an appropriate stage of the assembly process.

Figure 9:
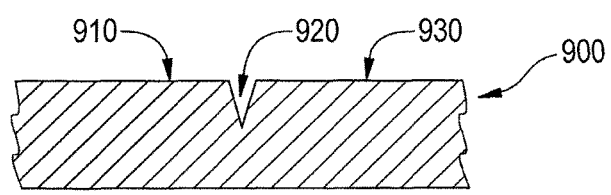
FIG. 9 is a side view of a section of a base plate that has been lanced on a first surface according to certain embodiments of the invention.
Figure 10:
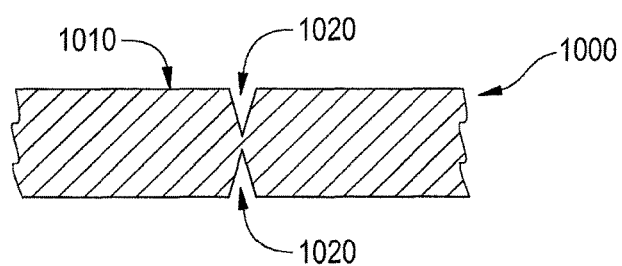
FIG. 10 is a side view of a section of a base plate that has been lanced on a first surface and a second surface according to certain embodiments of the invention.

In certain embodiments, base plate 900 may be lanced by striking a first surface of a first spanning portion 910 with a lancing punch along a first cleavage boundary 920 of base plate 900, as shown in FIG. 9. In certain embodiments, as shown in FIG. 10, base plate 1000 may be lanced by striking a first surface of a first spanning portion 1010 with a lancing punch along a first cleavage boundary 1020 of base plate 1000 and striking a second surface of the first spanning portion 1020 with a lancing punch along the first cleavage boundary, the second surface of the first spanning portion being substantially opposite the first surface of the first spanning portion. One of skill in the art will understand that either of the foregoing methods of lancing may be applied to any of the embodiments illustrated in FIGS. 3-7.

FIGS. 11-14 shows a method of fabricating a base plate for piezoelectric actuation according to certain embodiments of the invention. The base plate 1100 may be fabricated by providing a plate 1110, the plate 1110 defining a plate thickness 1320 and having a major surface 1330. A first removable portion 1120 may be struck in a first direction that is substantially normal to the major surface 1330 with a cutting punch 1310 to shear the first removable portion relative to the plate by a shear distance 1340. The shear distance may be less than the plate thickness 1320.

The first removable portion 1120 may be struck with a push back punch 1410 (shown in FIG. 14) in a second direction substantially opposite the first direction to reduce the shear distance 1340 by a reduction in shear that is less than the plate thickness 1320, such that the first removable portion 1120 becomes removable by a reduced shear force. The first removable portion 1120 may be left in place rather than removed from plate 1110 to prevent interlocking of multiple base plates 1100 and to add structural rigidity until removal of first removable portion 1120 at an appropriate stage of the assembly process. The reduction in shear may be substantially equal to the shear distance.

One of ordinary skill in the art will recognize that the shear distance 1340 may alternately be equal to or greater than plate thickness 1320, resulting in temporarily pressing first removable portion 1120 entirely out of plate 1110 and creating a first opening in plate 1110. In such embodiments, push back punch 1410 may push first removable portion 1120 in a second direction substantially opposite the first direction to reduce the shear distance 1340, thereby forcing first removable portion 1120 back into the first opening in plate 1110 to prevent interlocking of multiple base plates 1100 and to add structural rigidity until removal of first removable portion 1120 at an appropriate stage of the assembly process. In such embodiments, the reduction in shear may be substantially equal to the shear distance, such that major surface 1330 of the first removable portion 1120 lies substantially in a plane with a corresponding major surface of plate 1110.

FIG. 12 shows a base plate design with an alternative configuration for the first removable portion according to certain embodiments of the invention. The fabrication of base plate 1200 may include the steps of fabricating base plate 1100 and may additionally include creating at least one opening 1230 through plate 1210, the at least one opening 1230 adjacent to the first removable portion 1220. The fabrication of base plate 1200 may further include creating a second opening 1240 separate from at least one opening 1230. The first removable portion 1220 may be disposed between the at least one opening 1230 and the second opening 1240. The first removable portion 1220 may comprise at least a portion of a first edge of the plate such that the at least one opening is not completely enclosed by plate 1210 without first removable portion 1220.

One of ordinary skill in the art will recognize that a variety of combinations of openings, spanning portions, and cleavage boundaries may be utilized without deviating from the scope of the invention and that the foregoing embodiments are exemplary and non-limiting.

One of ordinary skill in the art will recognize that any portion of the periphery of any 15 spanning portion described herein or encompassed in equivalent embodiments of the invention may be lanced so that the spanning portion becomes removable by a reduced shear force where lanced. For example and without limitation, rather than creating the at least one opening 720 in the embodiment of FIG. 7, first cleavage boundary 740 may be connected to second cleavage boundary 750 by lancing along the connecting periphery of the area shown as 720 to form a composite cleavage boundary around a first removable portion (720+730). The first removable portion (720+730) may be left in place rather than removed from plate 710 to prevent interlocking of multiple base plates 700 and to add structural rigidity until removal of first removable portion (720+730) at an appropriate stage of the assembly process.

One of ordinary skill in the art further will recognize that in the embodiments of FIGS. 11-14, and similar embodiments within the scope of the invention, lancing may be used to create cleavage line(s) along which a removable portion may be removed from a final part by a reduced shear force, in lieu of the use of a cutting punch and a push back punch as described with respect to the embodiments of FIGS. 11-14.

One of ordinary skill in the art further will recognize that removable spanning portions as described herein may be created by any method for making such spanning portions removable by a reduced shear force without limitation to lancing without departing from the scope of the present invention without departing from the scope of the present invention.

One of ordinary skill in the art further will recognize that a portion of the base plate may be removed in any of the foregoing embodiments to form a swage opening 170 for connecting the base plate to an actuator arm via a swaging operation.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, operation or operations, to the objective, spirit, and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations is not a limitation of the invention.

What is claimed is:

1. A method of fabricating a base plate for a head suspension assembly that prevents interlocking of multiple base plates when packaged together and adds structural integrity during shipping, the method comprising:
    providing a plate;
    creating at least one opening through the plate, the plate including a first spanning portion that extends from a first side of the at least one opening to a second side of the at least one opening;
    lancing the first spanning portion adjacent the first side and adjacent the second side, so that the first spanning portion becomes removable by a reduced shear force where lanced;
    leaving the first spanning portion in place;
    packaging base plates with the first spanning portion in place for shipping to a destination; and
    removing the first spanning portion from each base plate upon receipt at the destination.

2. The method of claim 1, wherein lancing comprises striking a first surface of the first spanning portion with a lancing punch along a first cleavage boundary that is adjacent the first side and along a second cleavage boundary that is adjacent the second side.

3. The method of claim 2, wherein lancing comprises striking a second surface of the first spanning portion with a lancing punch along the first cleavage boundary and along the second cleavage boundary, the second surface of the first spanning portion being opposite the first surface of the first spanning portion.

4. The method of claim 1, wherein the plate further comprises a second spanning portion that extends from the first side to the second side, and further comprising:
    lancing the second spanning portion adjacent the first side and adjacent the second side, so that the second spanning portion becomes removable by a reduced shear force where lanced; and
    leaving the second spanning portion in place rather than removing the second spanning portion.

5. The method of claim 1, wherein the first spanning portion comprises at least a portion of a first edge of the plate such that the at least one opening is not completely enclosed by the plate without the first spanning portion.

6. The method of claim 1, further comprising: creating a second opening separate from the at least one opening.

7. The method of claim 6, wherein the first spanning portion is disposed between the at least one opening and the second opening.

8. The method of claim 4, wherein the first spanning portion comprises at least a portion of a first edge of the plate such that the at least one opening is not completely enclosed by the plate without the first spanning portion and the second spanning portion comprises at least a portion of a second edge of the plate such that a second opening through the plate is not completely enclosed by the plate without the second spanning portion.

9. The method of claim 4, wherein the first spanning portion comprises at least a portion of a first edge of the plate such that the at least one opening is not completely enclosed by the plate without the first spanning portion and the second spanning portion comprises at least a portion of a second edge of the plate such that the at least one opening through the plate is not completely enclosed by the plate without the second spanning portion.

10. The method of claim 1, further comprising: removing a portion of the base plate to form a swage opening for connecting the baseplate to an actuator arm via a swaging operation.

* * * * *